United States Patent
Schiedermeier et al.

(10) Patent No.: US 11,502,621 B2
(45) Date of Patent: Nov. 15, 2022

(54) METHOD FOR OPERATING AT LEAST TWO PULSE-WIDTH-MODULATED INVERTERS CONNECTED TO A DIRECT-CURRENT SUPPLY NETWORK, CIRCUIT ASSEMBLY, AND MOTOR VEHICLE

(71) Applicant: AUDI AG, Ingolstadt (DE)

(72) Inventors: Maximilian Schiedermeier, Ingolstadt (DE); Cornelius Rettner, Erlangen (DE)

(73) Assignee: AUDI AG, Ingolstadt (DE)

( * ) Notice: Subject to any disclaimer, the term of this patent is extended or adjusted under 35 U.S.C. 154(b) by 329 days.

(21) Appl. No.: 16/791,240

(22) Filed: Feb. 14, 2020

(65) Prior Publication Data
US 2020/0274462 A1   Aug. 27, 2020

(30) Foreign Application Priority Data
Feb. 21, 2019  (DE) .......................... 102019202335.5

(51) Int. Cl.
*H02M 7/53* (2006.01)
*H02M 7/5395* (2006.01)
(Continued)

(52) U.S. Cl.
CPC ........... *H02M 7/5395* (2013.01); *B60L 50/51* (2019.02); *G01R 19/0092* (2013.01);
(Continued)

(58) Field of Classification Search
CPC .............. H02M 7/5395; H02M 1/0009; G01R 19/0092; G01R 19/2513; B60L 50/51
See application file for complete search history.

(56) References Cited

U.S. PATENT DOCUMENTS

| | | | |
|---|---|---|---|
| 5,142,468 A | 8/1992 | Nerem | |
| 2004/0083802 A1* | 5/2004 | Wieser | G01M 17/0072 73/146 |

(Continued)

FOREIGN PATENT DOCUMENTS

| | | |
|---|---|---|
| DE | 102004057869 A1 | 6/2006 |
| DE | 10 2016 203044 A1 | 8/2017 |

(Continued)

OTHER PUBLICATIONS

German Examination Report dated Sep. 24, 2021, in connection with corresponding DE Application No. 10 2019 202 335.5 (7 pp., including machine-generated English translation).

(Continued)

*Primary Examiner* — Rafael O De Leon Domenech
(74) *Attorney, Agent, or Firm* — Maier & Maier, PLLC

(57) ABSTRACT

A method for operating at least two pulse-width-modulated inverters connected to a direct-current supply network. The pulse-width-modulated inverters are each actuated via an actuation signal and operated in an operating point. A phase difference is generated between the actuation signals of the at least two pulse-width-modulated inverters by adapting the actuation signal of at least one of the pulse-width-modulated inverters as a function of operating point information describing the operating points of the pulse-width-modulated inverters.

17 Claims, 2 Drawing Sheets

(51) Int. Cl.
  *B60L 50/51* (2019.01)
  *G01R 19/00* (2006.01)
  *G01R 19/25* (2006.01)
  *H02M 5/453* (2006.01)
  *H02M 1/00* (2006.01)

(52) U.S. Cl.
  CPC ........ *G01R 19/2513* (2013.01); *H02M 5/453* (2013.01); *H02M 1/0009* (2021.05)

(56) References Cited

U.S. PATENT DOCUMENTS

2012/0235617 A1 9/2012 Singh
2017/0279383 A1* 9/2017 Harada .................. H02P 27/08
2020/0094813 A1* 3/2020 Zhou .................. B60L 15/2009

FOREIGN PATENT DOCUMENTS

DE 102016217493 A1 3/2018
EP 2541755 A1 1/2013
JP 2012120296 A 6/2012

OTHER PUBLICATIONS

Search Report dated Jul. 13, 2020 in corresponding European Application No. 20157095.9; 11 pages including partial machine-generated English-language translation.
Examination Report dated Jan. 15, 2020 in corresponding German application No. 102019202335.5; 20 pages including Machine-generated English-language translation.
Examination Report dated Apr. 29, 2022 in European Application No. 20157095.9; 20 pages including machine generated English-language translation.

* cited by examiner

METHOD FOR OPERATING AT LEAST TWO PULSE-WIDTH-MODULATED INVERTERS CONNECTED TO A DIRECT-CURRENT SUPPLY NETWORK, CIRCUIT ASSEMBLY, AND MOTOR VEHICLE

FIELD

The disclosure relates to a method for operating at least two pulse-width-modulated inverters connected to a direct-current supply network, wherein the pulse-width-modulated inverters are each actuated via an actuation signal and operated in an operating point. Furthermore, the disclosure relates to a circuit assembly as well as a motor vehicle.

BACKGROUND

Pulse-width-modulated inverters are used to convert direct current into alternating current or alternating current into direct current. They can be used, for example, to operate electric motors via a direct voltage source, such as a battery. For example, the electric motors may be electric traction motors of motor vehicles, for example of battery electric vehicles or plug-in hybrid vehicles. With these vehicles, at least one electric traction motor is operated by means of a battery of the motor vehicle to enable purely electric driving of the motor vehicle, at least sometimes. In this case, the vehicles may have several traction motors which can be operated by means of a common battery and each of which is used to drive an axle or a wheel of the motor vehicle.

In a vehicle's electrical system which comprises a direct voltage source from which two or more pulse-width-modulated inverters are jointly supplied, there can be a superposition of faults generated by the respective switching processes of the pulse-width-modulated inverters in an undesirable manner. In particular with a design superposition, for example of faults expressed as current ripples or voltage ripples, interfering levels can occur in the vehicle's electrical system on the direct-current side. This is disadvantageous because further components connected to the pulse-width-modulated inverters on the direct-current side have to be adapted to such faults and/or configured based on the potentially occurring interfering levels. In particular, capacitors on the direct-current side used for filtering and/or smoothing the faults must be adapted to the interfering levels and, to that end, must have sufficient capacity and/or sufficient size. Various options are known from the prior art for operating pulse-width-modulated inverters connected via a common direct current power supply.

JP 2012 120296 A describes a drive control system which comprises two pulse-width-modulated inverters operated via a common direct current power supply and each of which comprises a pulse-width-modulated inverter connected to an electric motor. In order to reduce the current ripples occurring due to operation of the inverters in the direct-current power supply, the pulse-width-modulated inverters are operated at the same pulse frequency with simultaneous operation of the electric motors, wherein a fixed phase shift of one-forth a pulse length is set between pulse signals.

U.S. Pat. No. 5,142,468 A describes a circuit assembly for operating two electric motors which are used to drive an armored vehicle. The electric motors in this case are each actuated via an inverter. In order to also supply a further load with energy, in addition to the motors, the inverters can be operated with a phase shift of 180° in order to operate a circuit assembly for pulse formation as a load. If the circuit assembly does not require energy for pulse formation, the inverters are operated without a phase shift with respect to one another.

EP 2 541 755 A1 describes a drive device for a vehicle. In this case, an electric drive designed as a twin-row radial motor is used, which is operated via two pulse-width-modulated inverters connected in parallel and star windings coupled to one another. During generator operation, the two pulse-width-modulated inverters are isolated from one another and the two intermediate circuits are connected in series such that the total voltage of the intermediate circuit is double an individual intermediate circuit.

SUMMARY

The object of the disclosure is to provide an improved method for operating at least two pulse-width-modulated inverters connected to the direct-current supply network, particularly with respect to the occurrence of faults in a direct-current supply network.

In order to achieve this object, it is provided with a method of the aforementioned type according to the disclosure that a phase difference is generated between the actuation signals of the at least two pulse-width-modulated inverters by adapting the actuation signal of at least one of the pulse-width-modulated inverters as a function of operating point information describing the operating points of the pulse-width-modulated inverters.

In this case, the method according to the disclosure provides the advantage that the development of faults due to an unfavorable and/or uncontrolled phase relationship between pulses of the pulse-width-modulated inverter can be avoided. Particularly faults occurring in the direct-current supply network can be reduced through the formation of a phase difference between the actuation signals, said phase difference being adapted to the current operating points of the pulse-width-modulated inverters. In this case, the method according to the disclosure provides the advantage that the phase difference dependent on the operating point can be used with pulse-width-modulated inverters operating at the same pulse frequency as well as with pulse-width-modulated inverters operated at different pulse frequencies. Advantageously, faults developing not from the pulse frequency of the pulse-width-modulated inverters themselves but instead, for example, due to a second or a further harmonic, i.e. a multiple of the pulse frequency, can be reduced or eliminated by setting the phase difference. The cause of a fault or the cause of a major fault can vary according to the currently prevailing operating points of the at least two pulse-width-modulated inverters such that the best-possible fault suppression in the direct-current supply network can result for different combinations of operating points of the at least two pulse-width-modulated inverters by means of a different phase difference each. The respective operating points of the at least two pulse-width-modulated inverters are described by the operating point information such that the phase difference can be determined by means of the operating point information.

A further advantage of the method according to the disclosure is that the load from other components in the direct-current supply network is reduced due to the reduced fault amplitudes. The at least two pulse-width-modulated inverters may be particularly connected in parallel to one another in the direct-current supply network. Furthermore, capacitors which are used to reduce the ripples in the direct-current supply network, particularly capacitors connected to the rectifiers in parallel, can be designed smaller, i.e. with less capacity. Less capacity of a capacitor normally results in a more compact capacitor as well as reduced component costs such that circuit assemblies operated with the method according to the disclosure can be implemented in a space-saving and beneficial manner.

Particularly pulse-width-modulated inverters which are used to operate traction motors of an electric vehicle may result in different continually changing operating points of the respective pulse-width-modulated inverters during driving operation of the electric vehicle. The operating points in this case may result due to the running condition of the motor vehicle which is generated, at least partially, by the electric traction motors connected to the pulse-width-modulated inverters. In this case, the operating points of the at least two pulse-width-modulated inverters may particularly differ. Because the pulse-width-modulated inverters used to operate the electric traction motors are normally connected in parallel to a direct-current supply network comprising a high-voltage battery and/or a fuel cell system of the motor vehicle, faults may result in the direct-current supply network due to the switching processes of the pulse-width-modulated inverters, said switching processes being dependent on the operating point and thus different. The setting of the phase difference in this case can be used in generator operation and/or in motor operation of the electric traction motors.

The phase difference is created by adapting the actuation signal of at least one of the pulse-width-modulated inverters. The phase difference can also be generated by adapting one or more control signals of the pulse-width-modulated inverters when there are more than two pulse-width-modulated inverters, wherein the phase difference in this case may vary between different pairs of the more than two pulse-width-modulated inverters.

With continually changing operating points, continuously updated operating point information can be used which enables the determining of a phase difference after an operating point change and/or after a certain time span and setting of a phase difference adapted to the current operating points of the at least two pulse-width-modulated inverters.

According to the disclosure, it may be provided that the phase difference is set such that an alternating current occurring in the direct-current supply network and/or an alternating voltage occurring in the direct-current supply network is minimized By minimizing the alternating current and/or the alternating voltage, the amplitude of the alternating current and/or of the alternating voltage can be reduced and/or the occurrence of alternating current and/or alternating voltage can be suppressed completely.

According to the disclosure, it may be provided that a value of the phase difference is determined as a function of a measured variable of the direct-current supply network, particularly of a current measured in the direct-current supply network and/or a voltage measured in the direct-current supply network, and/or by means of a stored assignment set. A phase difference rule dependent on an operating point can be achieved as a function of a measured variable of the direct-current supply network by determining a value of the phase difference. When using a stored assignment set which assigns a certain phase difference value to certain combinations of operating points of the at least two pulse-width-modulated inverters, a controller can be implemented for the phase difference dependent on the operating point. A combination of a dependency on a measured variable of the direct-current supply network and a stored assignment set is also conceivable.

For the operating point information, it may be provided according to the disclosure that the alternating currents generated as a function of the pulse-width-modulated inverters is determined by the phase currents generated by the pulse-width-modulated inverters. Determination of the operating points from the alternating currents created by the pulse-width-modulated inverters or the phase currents created thereby has the advantage that, in many application cases, the alternating currents and/or the phase currents are already being measured to control operation of the pulse-width-modulated inverters in their respective operating point such that the corresponding measured values are already available. The operating point set in one of the pulse-width-modulated inverters can be determined by the alternating current created by the pulse-width-modulated inverters and/or the phase currents respectively created by the pulse-width-modulated inverter. To this end, the operating point information can be determined, for example, as a function of an amplitude of the alternating current, a frequency of the alternating current, and/or a curve of the alternating current over time. Accordingly, the operating point information can also be determined as a function of the amplitude of the respective phase currents, their respective chronological duration, and/or their respective curve over time.

Additionally or alternatively to this, it may be provided according to the disclosure that the operating point information is determined as a function of at least one measured variable of the direct-current supply network, particularly of a direct current and/or direct voltage in the direct-current supply network. The measured variables of the direct-current supply network, such as a direct current and/or a direct voltage of the direct-current supply network, can provide information on the current operating point of a pulse-width-modulated inverter. For example, it can be determined from the measured variable of the direct-current supply network whether electric motors operated with at least two pulse-width-modulated inverters are in motor operation or generator operation.

In a preferred embodiment of the disclosure, it may be provided that the pulse-width-modulated inverters are each connected to an electric motor, wherein the operating point information is determined as a function of setpoint torques to be generated by the respective electric motors and/or by setpoint speeds to be generated by the respective electric motors and/or by rotor position information describing a position of a rotor of the respective electric motor.

The setpoint torques to be generated by the respective electric motors and/or the setpoint speeds to be generated by the respective electric motors can be specified by a motor controller, for example, in a motor vehicle, wherein the at least two pulse-width-modulated inverters are actuated via their actuation signal such that the operating point of the pulse-width-modulated inverter requested is set according to the requested setpoint torque and/or the requested rotational speed. To determine the operating point information, it is also possible for rotor position information which describes a position of a rotor of the respective electric motor to be considered. Rotor position information can be provided, for example, via a sensor of the electric motor, which records the current rotor position, i.e. the current alignment of the rotor of the electric motor with respect to a stator of the electric motor.

According to the disclosure, it may be provided that the at least one pulse-width-modulated inverter is actuated to form the phase difference such that at least one period of its cycle is extended or shortened. In order to set a phase difference between the at least two pulse-width-modulated inverters, it is sufficient if a duration of its cycle is extended or shortened with at least one pulse-width-modulated inverter. In contrast with one or more further operated pulse-width-modulated inverters with an unchanged cycle, this then results in a phase difference which can be set by the extent of the shortening or the extending of the at least one period of the cycle. The change in at least one period of the cycle can be considered also a chronologically limited change in the pulse frequency of the cycle of the pulse-width-modulated inverter. If there are several pulse-width-modulated inverters being operated with different pulse frequencies, the second phase difference continually changes based on the frequency difference in the pulse frequencies. In such a case, it may be provided that the phase difference depending on the current operating points is reset after the elapse of a time span, for example, dependent on the frequency difference. It is also possible that a period of its cycle is extended or shortened when there are several or all of the at least two pulse-width-modulated inverters connected to the direct-current supply network in order to set the desired phase difference between the respective pulse-width-modulated inverters.

According to the disclosure, it may be provided that operation continues unchanged in order to form the phase difference of one of the pulse-width-modulated inverters, wherein the one pulse-width-modulated inverter or the further pulse-width-modulated inverters are actuated to form the phase difference or that all pulse-width-modulated inverters are activated to form the phase difference. In this manner, a phase difference can be set in a simple manner between the individual pulse-width-modulated inverters even in the event of three or more pulse-width-modulated inverters. One pulse-width-modulated inverter continues to be operated unchanged and can be characterized also as the master in this context. The other pulse-width-modulated inverters, which should have a phase difference in relation to the master, are actuated, for example, such that at least one period of their cycle is extended or shortened. It is also possible that the further pulse-width-modulated inverters, which can also be characterized as the slave, can be actuated such that they have a phase difference not only in relation to the master but also in relation to one another. This can be created accordingly by the selection of the extending of at least one period of the cycle or the shortening of at least one period of the cycle of a respective slave pulse-width-modulated inverter.

According to the disclosure, it may be provided that a driver is assigned to each pulse-width-modulated inverter, by means of said driver the pulse-width-modulated inverter is actuated with the actuation signal, wherein at least one of the drivers is actuated by a phase controller evaluating the operating point information in order to form the phase difference. The phase difference created, for example, by an extending or shortening of a period of the cycle can be created by adapting the actuation signal with which the pulse-width-modulated inverter is being actuated by the driver.

The phase difference dependent on the operating point can be determined via the phase controller evaluating the operating point information and it can be set by actuating at least one of the drivers. The phase controller in this case can be implemented as a control unit or as a part of a control unit and be connected to at least one data line and/or at least one signal line, by means of which the measured variables and/or information optionally being applied to determine the operating point information is provided, in order to determine the operating point information.

Furthermore, it may be provided according to the disclosure that pulse-width-modulated inverters are used in which the respectively assigned driver along with the phase controller are implemented as a common circuit, particularly as a microcontroller, or that at least one pulse-width-modulated inverter is used in which its assigned driver is connected to a phase controller formed as a further circuit via a signal line and/or a data communication line. Pulse-width-modulated inverters in which the respectively assigned drivers along with the phase controller are formed as a common circuit can be arranged, for example, also in the same housing, i.e. in the direct vicinity of one another. In this case, the at least two pulse-width-modulated inverters may be formed as a dual inverter or multi-mode inverter with a common control unit, wherein the control unit may comprise the drivers assigned to the pulse-width-modulated inverters and the phase controller as well.

However, it is also possible to use pulse-width-modulated inverters which are arranged spaced apart from one another, for example at various locations within a motor vehicle, wherein at least one pulse-width-modulated inverter is used, the assigned driver of which is connected to a phase controller formed as a further circuit via a signal line and/or a data communication line such that, with the assigned driver of the at least one pulse-width-modulated inverter, the phase controller can set the phase difference by adapting the actuation signal. The data communication line in this case may be designed as a data bus or digital line. A signal line formed to transfer an electric signal may also be used. It is also possible for one or more drivers of the at least one pulse-width-modulated inverter, which are connected to the phase controller, to be arranged on the same circuit boards as the phase controller or such that the they are connected spaced apart therefrom and via, for example, a signal line and/or data communication line formed as lines, ribbon cable, or the like.

According to the disclosure, it may be provided that pulse-width-modulated inverters with two-level topology and/or pulse-width-modulated inverters with multilevel topology are used and/or that pulse-width-modulated inverters with three phases are used and/or that pulse-width-modulated inverters with more than three phases are used. It is possible that the at least two pulse-width-modulated inverters connected to the direct-current supply network each have the same topology and/or the same number of phases or that pulse-width-modulated inverters different than the at least two pulse-width-modulated inverters are used, i.e. pulse-width-modulated inverters with different topology and/or a different number of phases.

In a preferred embodiment of the disclosure, it may be provided that pulse-width-modulated inverters with semiconductor switchers are used, particularly with MOSFETs, IGBTs, and/or diodes. The use of other types of semiconductor elements and/or a combination of other semiconductor elements and MOSFETs, IGBTs, and/or diodes is also conceivable for the at least two pulse-width-modulated inverters.

According to the disclosure, it may be provided that a direct-current supply network with a voltage between 40 V and 1200 V is used and/or that a direct-current supply network with a capacitor is used, particularly a film capacitor, ceramic capacitor, or an electrolyte capacitor. In particular, it may be provided that a direct-current supply network is used having precisely one capacitor. In this case, the capacitor may be arranged parallel to the direct-current voltage connections of the at least two pulse-width-modulated inverters. Particularly with at least two pulse-width-modulated inverters arranged in the close to one another or in a common housing, the use of precisely one capacitor can lead to savings on costs and/or size and is advantageously possible due to the faults in the direct-current supply network being reduced by the phase difference, which reduce the required capacity as a whole.

It is provided for a circuit assembly according to the disclosure that it comprises a direct-current supply network as well as at least two pulse-width-modulated inverters connected to the direct-current supply network, said pulse-width-modulated inverters being actuatable via an actuation signal and being operable in an operating point, wherein the circuit assembly comprises a control unit, which is formed to implement a method according to the disclosure.

The at least two pulse-width-modulated inverters in this case may be particularly connected in parallel to one another in the direct-current supply network.

According to the disclosure, it may be provided that a driver of the switching circuit is assigned to each pulse-width-modulated inverter, by means of said driver the pulse-width-modulated inverter can be actuated with the actuation signal, wherein at least one of the drivers can be actuated by a phase controller of the control unit evaluating the operating point information, in order to form the phase difference.

Furthermore, it may be provided according to the disclosure that the drivers along with the phase controller are implemented as a common circuit, particularly as a microcontroller, or that the one driver or drivers of at least one of the pulse-width-modulated inverters are connected to a phase controller formed as a further circuit via a signal line and/or a data communication line.

All of the advantages and embodiments described with reference to the method according to the disclosure also apply accordingly to the circuit assembly according to the disclosure.

It is provided for a motor vehicle according to the disclosure that it comprises a circuit assembly according to the disclosure.

The circuit assembly in this case can be used to operate two or more electric motors in the motor vehicle. The electric motors can be, for example, electric traction motors and/or drive motors of electric compressors or the like. With the traction motors, it is possible for the motor vehicle to comprise, for example, two, three, or four traction motors. A motor vehicle comprising two traction motors may have, for example, two traction motors coupled to a wheel or an axle. A motor vehicle with three traction motors may comprise, for example, an electric motor coupled to a front axle of the motor vehicle as well as electric motors coupled to a rear wheel of the motor vehicle. It may be provided with a motor vehicle comprising four traction motors that it has four electric motors designed as wheel hub motors.

The traction motors of the motor vehicle may each be operated via their own pulse-width-modulated inverters, wherein the energy needed to operate the traction motors is stored in an energy storage device of the motor vehicle, for example in a high-voltage battery or a fuel cell system of the motor vehicle. The energy storage device can be connected to the pulse-width-modulated inverters via the direct-current supply network. Further motor vehicle components operated with direct current may be provided in the direct-current supply network. The direct-current supply network of the motor vehicle in this case may be a high-voltage direct-current supply network, which is operated at a voltage between 40 V and 1200 V.

All of the advantages and embodiments described with reference to the method according to the disclosure and/or to the circuit assembly according to the disclosure also apply accordingly to the motor vehicle according to the disclosure.

BRIEF DESCRIPTION OF THE DRAWINGS

Further advantages and individual details of the disclosure result from the exemplary embodiments described in the following as well as the corresponding drawings. The drawings are schematic depictions and show the following.

DETAILED DESCRIPTION

Figure 1:
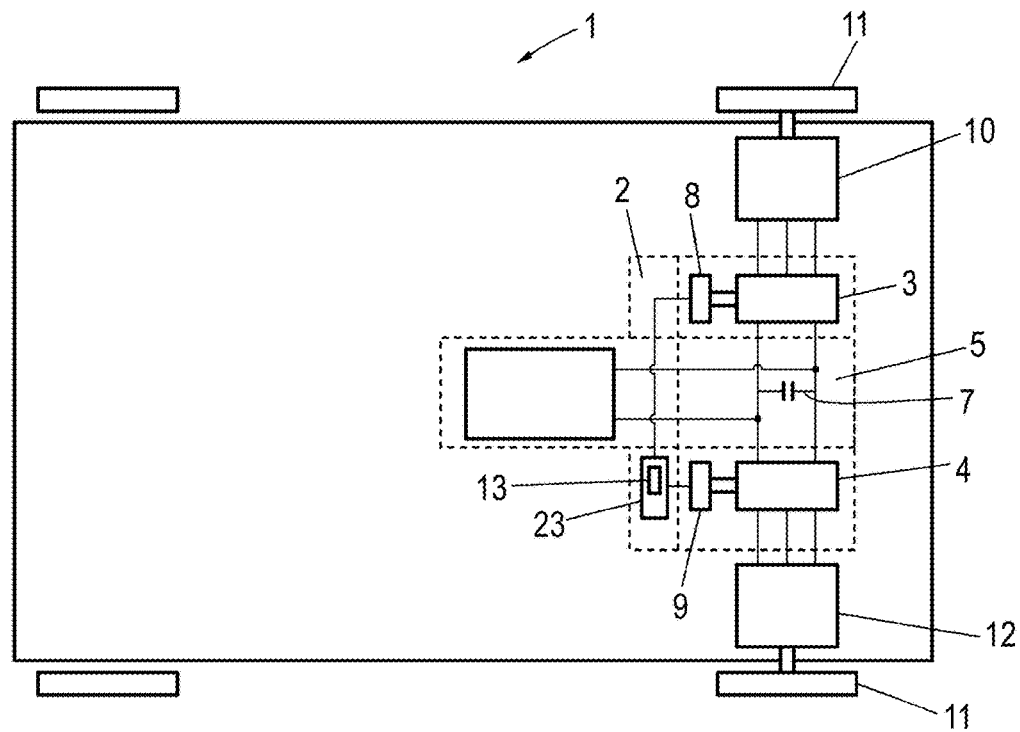
FIG. 1 a view of a motor vehicle according to the disclosure.

FIG. 1 shows a schematic view of a motor vehicle 1 according to the disclosure. The motor vehicle 1 comprises a circuit assembly 2, which comprises two pulse-width-modulated inverters 3, 4. The pulse-width-modulated inverters 3, 4 are connected to a direct-current supply network 5. The pulse-width-modulated inverters 3, 4 are connected in parallel to an energy storage device 6 as well as a capacitor 7 in the direct-current supply network 5.

A driver 8 or 9, by means of which the respective pulse-width-modulated inverter 3, 4 can be actuated with an actuation signal, is assigned to the pulse-width-modulated inverters 3, 4. Pulse-width-modulated inverter 3 is connected to an electric motor 10, which is coupled mechanically to a wheel 11 of the motor vehicle 1. Accordingly, pulse-width-modulated inverter 4 is connected to an electric motor 12, which likewise is coupled mechanically to a wheel 11 of the motor vehicle 1. The pulse-width-modulated inverters 3, 4 are used to convert the electrical energy coming from the energy storage device 6 via the direct-current supply network 5 into an alternating current for operating the electric motors 10, 12. The wheels 11 of the motor vehicle 1 are driven by means of the electric motors 10, 12, and the vehicle 1 is moved. In contrast, in generator operation of the electric motors 10, 12, the alternating current generated by the electric motors can be converted into a direct current by the pulse-width-modulated inverters 3, 4 in order to charge the energy storage device 6. The energy storage device 6 may be designed as a high-voltage battery or as a fuel cell system. The voltage of the direct-current supply network 5 may be, for example, between 40 V and 1200 V.

The circuit assembly 2 furthermore comprises a control unit 23, which has a phase controller 13. The drivers 8, 9 of the pulse-width-modulated inverters 3, 4 can be actuated to adapt their respective actuation signal, which actuates the assigned pulse-width-modulated inverters 3 or 4 via the phase controller of the control unit 23. During operation of the motor vehicle 1, continually different operating points of the pulse-width-modulated inverters 3, 4 can develop. These operating points are based, for example, on the operation of the electric motors 10, 12 depending on the driving situation. Due to the switching processes of the pulse-width-modulated inverters 3, 4 in their respective operating points caused by operation, faults can occur in the direct-current supply network 5. These faults may be recorded as an alternating current or alternating voltage being superimposed on the direct current or the direct voltage in the direct-current supply network 5.

In order to reduce the effects of these faults on other components of the direct-current supply network 5, for example on the energy storage device 6, the capacitor 7 is provided, by means of which smoothing of the faults can be achieved. Furthermore, a reduction in these faults is thereby achieved in that a phase difference dependent on the operating points of the pulse-width-modulated inverters 3, 4 is set between the actuation signals of the at least two pulse-width-modulated inverters 3, 4 via the phase controller of the control unit 13. This makes it possible to design the capacitor 7 smaller, i.e. with less capacity, because it only has to compensate for already reduced faults in the direct-current supply network 5. The capacitor 7 may be designed as a film capacitor, ceramic capacitor, or an electrolyte capacitor.

Figure 2:
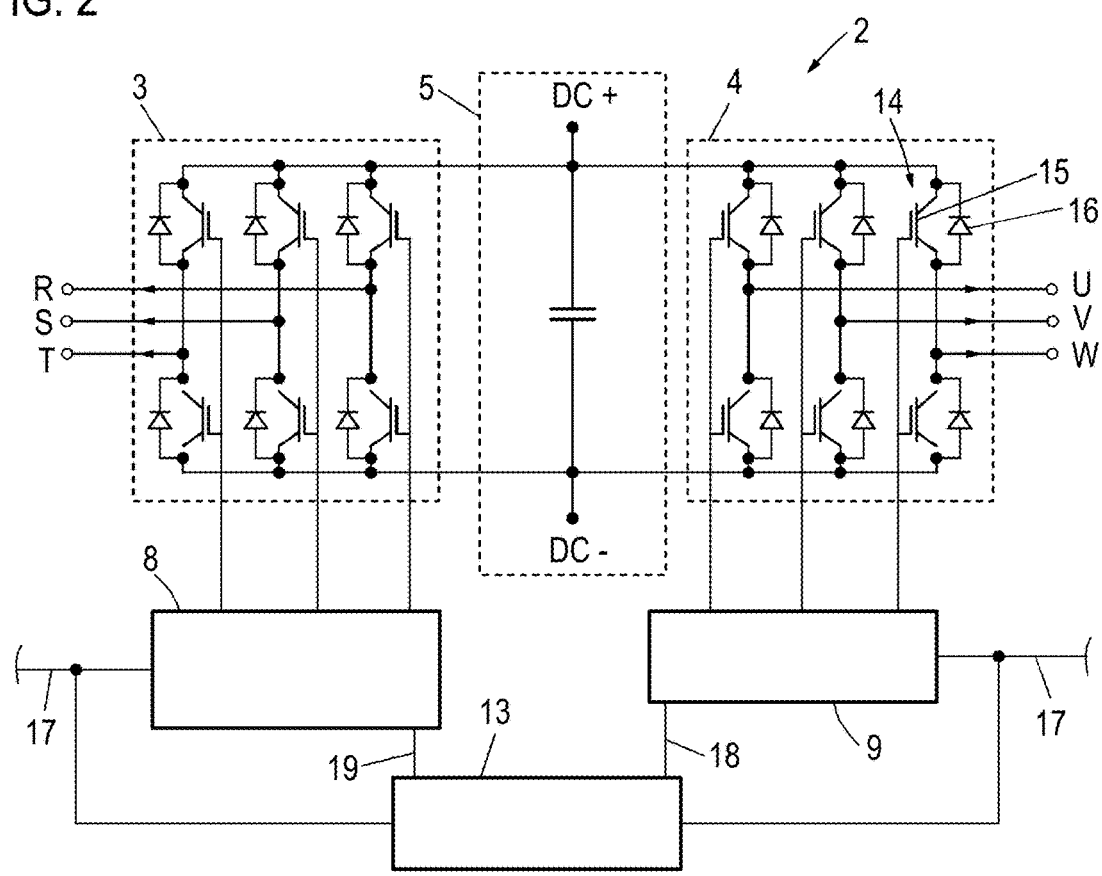
FIG. 2 a circuit assembly according to the disclosure.

FIG. 2 shows the circuit assembly 2. The pulse-width-modulated inverters 3, 4 here comprise six semiconductor switches 14, each of which has a transistor 15 designed as a MOSFET or IGBT, as well as a semiconductor diode 16. Through switching of the semiconductor switches 14, the direct current provided via the energy storage device 6 connected to the DC+ and/or DC− contacts of the direct-current supply network 5 can be inverted, for example, in order to operate the electric motor 10, 12 shown in FIG. 1. The shown pulse-width-modulated inverters 3, 4 convert the direct current of the direct-current supply network 5 into a three-phase alternating current. The three phases of the pulse-width-modulated inverter 3 are indicated by R, S, and T. The three phases of the inverter 4 are indicated accordingly by U, V, and W.

These semiconductor switches 14 of the pulse-width-modulated inverters 3 and/or 4 are each connected to the assigned drivers 8 and/or 9, wherein the switching processes of the semiconductor switches 14 are activated by the actuation signals generated by the drivers 8, 9. The operating points of the pulse-width-modulated inverters 3, 4 develop as a function of the operating state to be set of the loads operated by the pulse-width-modulated inverters 3, 4, such as the previous reference to the electric motors 10, 12 described in FIG. 1.

Depending on the combination of operating points of the pulse-width-modulated inverters 3, 4, undesirable faults, as previously described, can occur in the direct-current supply network 5. In order to prevent these faults, a phase difference, which is set subsequently by adapting at least one actuation signal of one of the drivers 8, 9, is determined by the phase controller 13 as a function of operating point information describing the operating points of the pulse-width-modulated inverters 3, 4.

The operating point information in this case can be determined by the phase controller 13 as a function of the alternating currents generated by the pulse-width-modulated inverters 3, 4. In doing so, the amplitude, the frequency, and/or the curve of an alternating current over time created via phases R, S, and T or U, V, and W, respectively, can be evaluated. It is also possible for the operating point information to be determined as a function of the phase currents created by the pulse-width-modulated inverters 3, 4, wherein, for example, the amplitude, the duration over time, and/or the curve over time of the respective phase currents of phases R, S, and T as well as U, V, and W can be evaluated. In order to determine the alternating currents respectively created by the pulse-width-modulated inverters 3, 4 and/or to determine the phase currents created by the pulse-width-modulated inverters 3, 4, the phase controller 13 is connected to current sensors (not shown here) arranged at phases R, S, and T as well as U, V, and W.

Additionally or alternatively to this, the phase controller 13 can determine the operating point information as a function of at least one measured variable of the direct-current supply network 5. A direct current and/or direct voltage of the direct-current supply network 5 can be used as the measured variable of the direct-current supply network 5. To this end, the phase controller 3 may be connected to one or more sensors (not shown here), which measure a direct current and/or a direct voltage in the direct-current supply network 5.

Additionally or alternatively to a measurement of the measured variable in the direct-current supply network and/or the measurement of the alternating currents and/or the phase currents, it is also possible to determine parameters for ascertaining the operating point information via a data communication line formed as a data bus 17 at the phase controller 13. The drivers 8, 9 of the pulse-width-modulated inverters 3, 4 are connected to the data bus 17, by means of which parameters of the operating point to be set by the pulse-width-modulated inverters 3, 4 are transmitted to the drivers 8, 9. In reference to the previously described electric motors 10, 12, this may be, for example, the setpoint torques to be generated by the respective electric motors 10, 12 and/or the setpoint speeds to be generated by the respective electric motors 10, 12. The operating point information can be determined by the phase controller 13 as a function of these setpoint torques and/or these setpoint speeds. Additionally or alternatively to this, rotor position information transmitted via the data communication line 17 and which describes a position of a rotor of the respective electric motors 10, 12 can also be considered.

The phase controller 13 can ascertain operating point information describing the operating points of the pulse-width-modulated inverters 3, 4 based on the obtained parameters and/or information and/or the obtained measured values. The phase controller 13 ascertains a phase difference as a function of the operating point information, i.e. depending on the respectively set operating points of the pulse-width-modulated inverters 3, 4. This phase difference can be determined from an assignment set, which is stored in a memory unit of the phase controller 13. Additionally or alternatively to this, the phase difference can be determined as a function of a measured variable of the direct-current supply network 5, such as of a current measured in the direct-current supply network 5 and/or of a voltage measured in the direct-current supply network 5. The determination of the phase difference by the phase controller 13 in this case takes place such that an alternating current occurring in the direct-current supply network 5 and/or an alternating voltage occurring in the direct-current supply network 5 is minimized.

The phase difference is thereby set in that the driver 9 of pulse-width-modulated inverter 4 is actuated to adapt the actuation signal from the driver 9 by means of the phase controller 13, via a signal line 18. Driver 8 connected to the phase controller 13 via a signal line 19 is not actuated, i.e. the actuation signal of driver 8 is transferred to pulse-width-modulated inverter 3 without change. Alternatively, the phase difference can also be set in that both drivers 8, 9 are actuated.

For example, with a phase difference value of 30°, it is possible to actuate one of the drivers 8, 9 such that a duration of the cycle, generated via the actuation signal, of the assigned pulse-width-modulated inverters 3, 4 is extended such that a phase difference of 30° is set. However, a phase difference can also thereby be set in that both drivers 8, 9 are actuated such that overall a phase difference of 30° results, for example in that a duration of a cycle of one of the pulse-width-modulated inverters 3, 4 is shortened such that a phase shift of +15° is set and a duration of the cycle of the other pulse-width-modulated inverter 3, 4 is extended such that a phase shift of −15° results.

Figure 3:
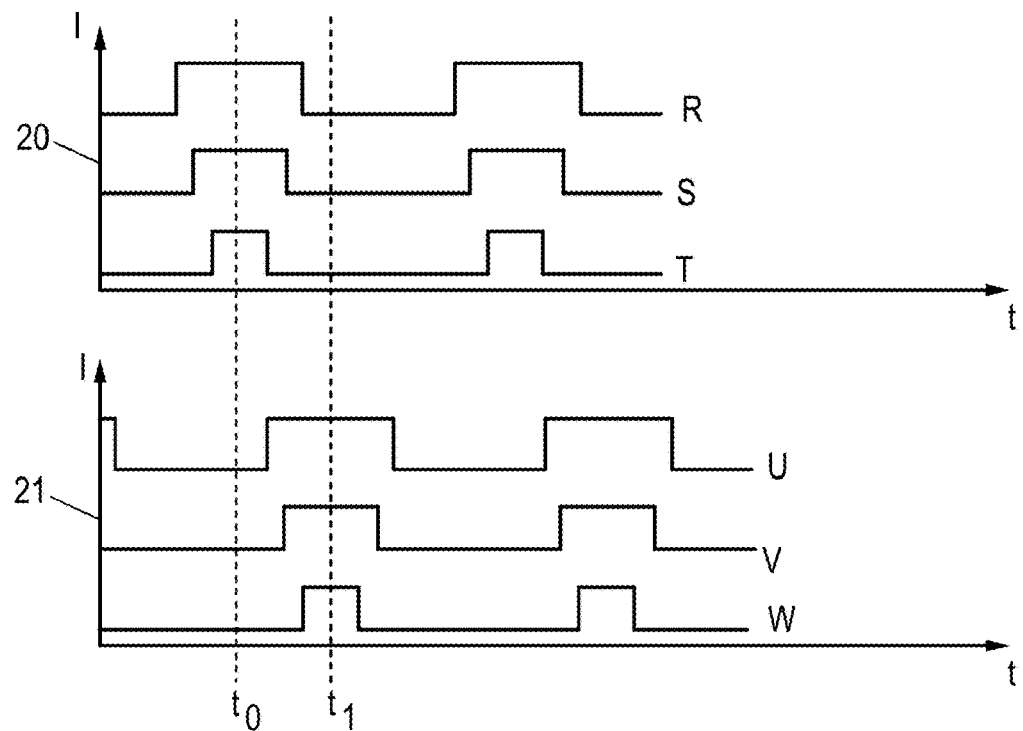
FIG. 3 a diagram of the phase currents of two pulse-width-modulated inverters.

FIG. 3 shows a diagram of the phase currents of two pulse-width-modulated inverters 3, 4. Phase currents of phases R, S, T of pulse-width-modulated inverter 3 are shown in the upper part 20 of the diagram. Phase currents of phases U, V, W of pulse-width-modulated inverter 4 are shown in the lower part 21 of the diagram. A phase difference is generated at point in time $t_0$. To this end, the actuation signal, which is generated by driver 9, is adapted such that a duration of the cycle of pulse-width-modulated inverter 4 is extended. The phase currents of two pulse-width-modulated inverter 4, generated in phase equalization with the phase currents of pulse-width-modulated inverter 3 at point in time $t_0$, are shifted due to the extension of the duration of the cycle of pulse-width-modulated inverter 4 at point in time $t_1$. It is shown that a phase difference forms between the cycles of the pulse-width-modulated inverters 3, 4, which were formerly operated in phase equalization, said phase difference also being reflected correspondingly in the curve of the phase currents over time.

The curve of the phase current shown in parts 20, 21 of the diagram is purely for example. In particular, it is also possible for the phase shift to be created by a reduction in the duration of the cycle of one of the pulse-width-modulated inverters 3, 4. It is also possible for both pulse-width-modulated inverters 3, 4 to be actuated to generate the phase difference, wherein, for example, the cycle of one of the pulse-width-modulated inverters 3, 4 is shortened and the cycle of the other pulse-width-modulated inverter 3, 4 is extended such that, as a whole, the phase difference determined by the phase controller 13 is set. Furthermore, a phase difference can also be set without phase-equalization operation of the pulse-width-modulated inverters 3, 4. In particular, it is also possible for the pulse-width-modulated inverters 3, 4 to have different pulse frequencies.

The drivers 8, 9 as well as the phase controller 13 can be implemented as a common circuit, for example as a microcontroller. This circuit can be situated with the pulse-width-modulated inverters 3, 4 in a common housing. It is also possible for the phase controller 13 to be implemented with only one of the drivers 8, 9 as a common circuit, wherein the other driver 8, 9 is connected to the phase controller via a signal line 18 and/or 19 designed, for example, as a trace or circuit board or as a cable. The phase controller 13 can also be designed as an independent circuit, for example as a control unit, and be connected to the drivers 8, 9 via a respective signal line 18, 19 designed as a trace or as a cable. The signal lines 18, 19 may also be designed as a data communication connection, for example as a data bus.

Figure 4:
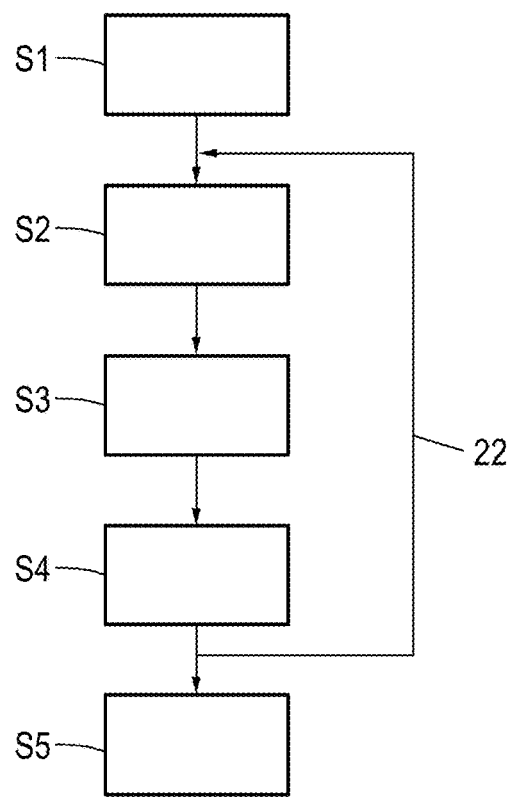
FIG. 4 a flowchart of a method according to the disclosure.

FIG. 4 shows a flowchart of a method according to the disclosure. The start of the method takes place in step S1. In step S2, operating point information is ascertained by the phase controller 13, as previously described, said information describing the respective operating points of the pulse-width-modulated inverters. Subsequently, in step S3 as previously described, a phase difference is determined by the phase controller 13 as a function of the ascertained operating point information. In step S4, the adaptation of the actuation signal of at least one of the pulse-width-modulated inverters 3, 4 takes place in order to generate the phase difference between the pulse-width-modulated inverters 3, 4. Subsequently, as indicated by the arrow 22, re-determining of operating point information can occur by means of the phase controller 13. A modified operating point of at least one of the pulse-width-modulated inverters 3, 4 can thereby be responded to such that a new phase difference is determined in a corresponding adaptation of the actuation signal of at least one of the pulse-width-modulated inverters 3, 4. The method ends in step S5.

In addition to the previously described designs with two pulse-width-modulated inverters 3, 4, it is also possible to use more than two pulse-width-modulated inverters 3, 4. Even when there are more than two pulse-width-modulated inverters 3, 4, a phase difference can be created by adapting the actuation signal of one or more of the pulse-width-modulated inverters 3, 4. In particular, it is possible that pulse-width-modulated inverters 3, 4 with two-level topology and/or pulse-width-modulated inverters 3, 4 with multilevel topology are used and/or that pulse-width-modulated inverters 3, 4 with three phases are used and/or that pulse-width-modulated inverters 3, 4 with more than three phases are used. It is possible that the at least two pulse-width-modulated inverters 3, 4 connected to the direct-current supply network 5 each have the same topology and/or the same number of phases or that different pulse-width-modulated inverters 3, 4 are used, i.e. pulse-width-modulated inverters 3, 4 with different topology and/or a different number of phases.

The invention claimed is:

1. A method for operating at least two pulse-width-modulated inverters connected to a direct-current supply network, comprising:
   the pulse-width-modulated inverters are each actuated via an actuation signal and operated in an operating point,
   wherein a phase difference is generated between the actuation signals of the at least two pulse-width-modulated inverters by adapting the actuation signal of at least one of the pulse-width-modulated inverters as a function of operating point information describing the operating points of the pulse-width-modulated inverters,
   wherein the pulse-width-modulated inverters are each connected to an electric motor,
   wherein the operating point information is determined as a function of setpoint torques to be generated by the respective electric motors,
   wherein the phase difference is generated between at least two distinct pulse-width-modulated inverters.

2. The method according to claim 1, wherein the phase difference is set such that an alternating current occurring in the direct-current supply network and/or an alternating voltage occurring in the direct-current supply network is minimized.

3. The method according to claim 1, wherein a value of the phase difference is determined as a function of a measured variable of the direct-current supply network, particularly of a current measured in the direct-current supply network and/or a voltage measured in the direct-current supply network, and/or by a stored assignment rule.

4. The method according to claim 1, wherein the operating point information is ascertained as a function of the alternating currents generated by the pulse-width-modulated inverters, particularly by phase currents generated by the pulse-width-modulated inverters.

5. The method according to claim 1, wherein the operating point information is ascertained as a function of at least one measured variable of the direct-current supply network, particularly of a direct current and/or direct voltage in the direct-current supply network.

6. The method according to claim 1, wherein the operating point information is further determined as a function of setpoint speeds to be generated by the respective electric motors and/or a function of rotor position information describing a position of a rotor of the respective electric motor.

7. The method according to claim 1, wherein at least one of the pulse-width-modulated inverter is actuated to form the phase difference such that at least one period of its cycle is extended or shortened.

8. The method according to claim 1, wherein operation continues unchanged in order to form the phase difference of one of the pulse-width-modulated inverters, wherein the one or the other pulse-width-modulated inverters are actuated to form the phase difference or all pulse-width-modulated inverters are activated to form the phase difference.

9. The method according to claim 1, wherein a driver is respectively assigned to each pulse-width-modulated inverter, wherein by the driver the pulse-width-modulated inverter is actuated with the actuation signal, wherein at least one of the drivers is actuated by a phase controller evaluating the operating point information in order to form the phase difference.

10. The method according to claim 9, wherein pulse-width-modulated inverters are used in which the respectively assigned driver, together with the phase controller, is implemented as a common circuit, particularly as a microcontroller, or that at least one pulse-width-modulated inverter is used in which its assigned driver is connected to a phase controller formed as a further circuit via a signal line and/or a data communication line.

11. The method according to claim 1, wherein the pulse-width-modulated inverters have two-level topology and/or the pulse-width-modulated inverters have multilevel topology and/or that the pulse-width-modulated inverters have three phases and/or the pulse-width-modulated inverters have more than three phases are used.

12. The method according to claim 1, wherein pulse-width-modulated inverters with semiconductor switches, particularly with MOSFETs, IGBTs, and/or diodes are used.

13. The method according to claim 1, wherein the direct-current supply network has a voltage between 40 V and 1200 V and/or the direct-current supply network has a capacitor, particularly a film capacitor, ceramic capacitor, or an electrolyte capacitor.

14. A circuit assembly comprising:
a direct-current supply network and at least two pulse-width-modulated inverters connected to the direct-current supply network, said pulse-width-modulated inverters being actuatable via an actuation signal and being operable in an operating point, wherein the circuit assembly includes a control unit, which is formed to implement a method for operating at least two pulse-width-modulated inverters connected to a direct-current supply network, comprising:
the pulse-width-modulated inverters are each actuated via an actuation signal and operated in an operating point,
wherein a phase difference is generated between the actuation signals of the at least two pulse-width-modulated inverters by adapting the actuation signal of at least one of the pulse-width-modulated inverters as a function of operating point information describing the operating points of the pulse-width-modulated inverters,
wherein the pulse-width-modulated inverters are each connected to an electric motor,
wherein the operating point information is determined as a function of setpoint torques to be generated by the respective electric motors,
wherein the phase difference is generated between at least two distinct pulse-width-modulated inverters.

15. The circuit assembly according to claim 14, wherein a driver of the circuit assembly is respectively assigned to each pulse-width-modulated inverter, by which the pulse-width-modulated inverter can be actuated with the actuation signal, wherein at least one of the drivers can be actuated by a control unit phase controller evaluating the operating point information, in order to form the phase difference.

16. The circuit assembly according to claim 15, wherein the drivers along with the phase controller are implemented as a common circuit, particularly as a microcontroller, or in that the driver or drivers of at least one of the pulse-width-modulated inverters are connected to a phase controller formed as a further circuit via a signal line and/or a data communication line.

17. A motor vehicle comprising a circuit assembly comprising:
a direct-current supply network and at least two pulse-width-modulated inverters connected to the direct-current supply network, said pulse-width-modulated inverters being actuatable via an actuation signal and being operable in an operating point, wherein the circuit assembly includes a control unit, which is formed to implement a method for operating at least two pulse-width-modulated inverters connected to a direct-current supply network, comprising:
the pulse-width-modulated inverters are each actuated via an actuation signal and operated in an operating point,
wherein a phase difference is generated between the actuation signals of the at least two pulse-width-modulated inverters by adapting the actuation signal of at least one of the pulse-width-modulated inverters as a function of operating point information describing the operating points of the pulse-width-modulated inverters,
wherein the pulse-width-modulated inverters are each connected to an electric motor,
wherein the operating point information is determined as a function of setpoint torques to be generated by the respective electric motors,
wherein the phase difference is generated between at least two distinct pulse-width-modulated inverters.

* * * * *